(12) United States Patent
Chu et al.

(10) Patent No.: US 12,315,772 B2
(45) Date of Patent: *May 27, 2025

(54) PACKAGE AND MANUFACTURING METHOD THEREOF

(71) Applicant: Taiwan Semiconductor Manufacturing Company, Ltd., Hsinchu (TW)

(72) Inventors: Yung-Chi Chu, Kaohsiung (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/355,379

(22) Filed: Jul. 19, 2023

(65) Prior Publication Data

US 2023/0360985 A1    Nov. 9, 2023

Related U.S. Application Data

(63) Continuation of application No. 16/897,287, filed on Jun. 10, 2020, now Pat. No. 11,798,857.

(Continued)

(51) Int. Cl.
| | |
|---|---|
| *H01L 23/31* | (2006.01) |
| *C08G 73/22* | (2006.01) |
| *C08K 5/134* | (2006.01) |
| *C08L 33/24* | (2006.01) |
| *C08L 79/08* | (2006.01) |
| *H01L 21/768* | (2006.01) |
| *H01L 23/16* | (2006.01) |

(52) U.S. Cl.
CPC .............. *H01L 23/31* (2013.01); *C08G 73/22* (2013.01); *C08K 5/1345* (2013.01); *C08L 33/24* (2013.01); *C08L 79/08* (2013.01); *H01L 21/76802* (2013.01); *H01L 23/16* (2013.01)

(58) Field of Classification Search
CPC ..... H01L 24/19; H01L 23/5389; H01L 21/56; H01L 2224/0401; H01L 2224/04105; H01L 2224/18; H01L 2924/181; H01L 2924/1815; H01L 23/5386; H01L 2924/18162; H01L 23/3185; H01L 23/3675; H01L 23/481; H01L 23/5226; H01L 23/3107; H01L 23/31; H01L 23/16; H01L 23/3135; H01L 23/315
See application file for complete search history.

(56) References Cited

U.S. PATENT DOCUMENTS

| | | | | |
|---|---|---|---|---|
| 6,492,203 | B1 * | 12/2002 | Wakashima | ........ H01L 21/4803 |
| | | | | 257/E23.101 |
| 6,617,193 | B1 * | 9/2003 | Toshio | .................... H01L 23/13 |
| | | | | 257/E23.101 |

(Continued)

*Primary Examiner* — Bac H Au
(74) *Attorney, Agent, or Firm* — JCIPRNET

(57) ABSTRACT

A package includes a die, an encapsulant, and a redistribution structure. The encapsulant laterally encapsulates the die. The redistribution structure is over the die and the encapsulant. The redistribution structure partially exposes the die. A top surface of the redistribution structure is slanted downward continuously from an edge of the package toward an interior of the package.

20 Claims, 16 Drawing Sheets

Related U.S. Application Data

(60) Provisional application No. 62/906,748, filed on Sep. 27, 2019.

(56) References Cited

U.S. PATENT DOCUMENTS

| | | | | |
|---|---|---|---|---|
| 9,048,222 | B2* | 6/2015 | Hung | H01L 23/5384 |
| 11,004,786 | B2* | 5/2021 | Tai | H01L 23/3171 |
| 11,289,396 | B2* | 3/2022 | Chu | H01L 23/585 |
| 11,798,857 | B2* | 10/2023 | Chu | H01L 24/18 |
| 12,087,654 | B2* | 9/2024 | Chu | H01L 27/14636 |
| 2009/0302450 | A1* | 12/2009 | Ohde | H01L 23/49822 |
| | | | | 257/E23.116 |
| 2012/0217607 | A1* | 8/2012 | Hanai | H01L 27/1469 |
| | | | | 438/66 |
| 2016/0218136 | A1* | 7/2016 | Lee | H01L 27/14645 |
| 2017/0278766 | A1* | 9/2017 | Kim | H01L 23/5386 |
| 2018/0294299 | A1* | 10/2018 | Baek | G06V 40/1318 |
| 2018/0337142 | A1* | 11/2018 | Cheng | H01L 23/04 |
| 2019/0006315 | A1* | 1/2019 | Hsu | H01L 25/105 |
| 2019/0229055 | A1* | 7/2019 | So | H01L 21/6835 |
| 2020/0105638 | A1* | 4/2020 | Chiang | H01L 21/561 |
| 2021/0098636 | A1* | 4/2021 | Tai | H01L 21/56 |
| 2021/0343638 | A1* | 11/2021 | Chu | H01L 21/56 |
| 2022/0230980 | A1* | 7/2022 | Hu | H01L 24/82 |

* cited by examiner

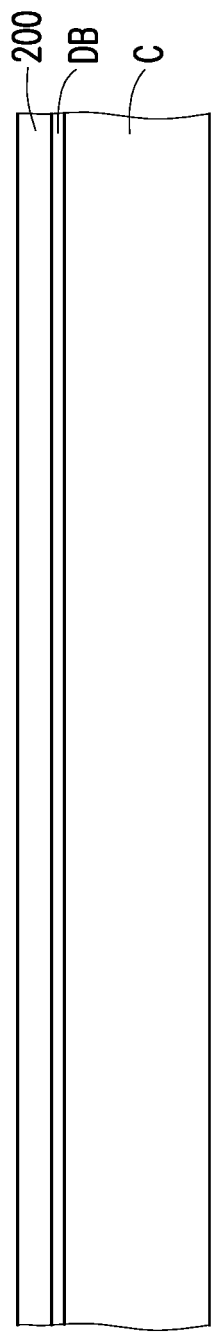
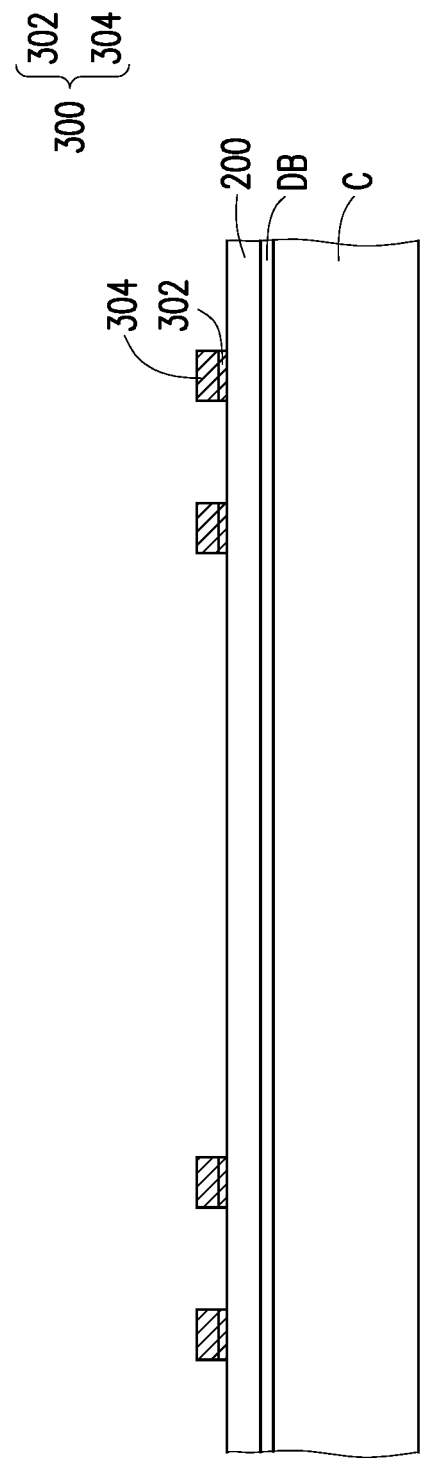

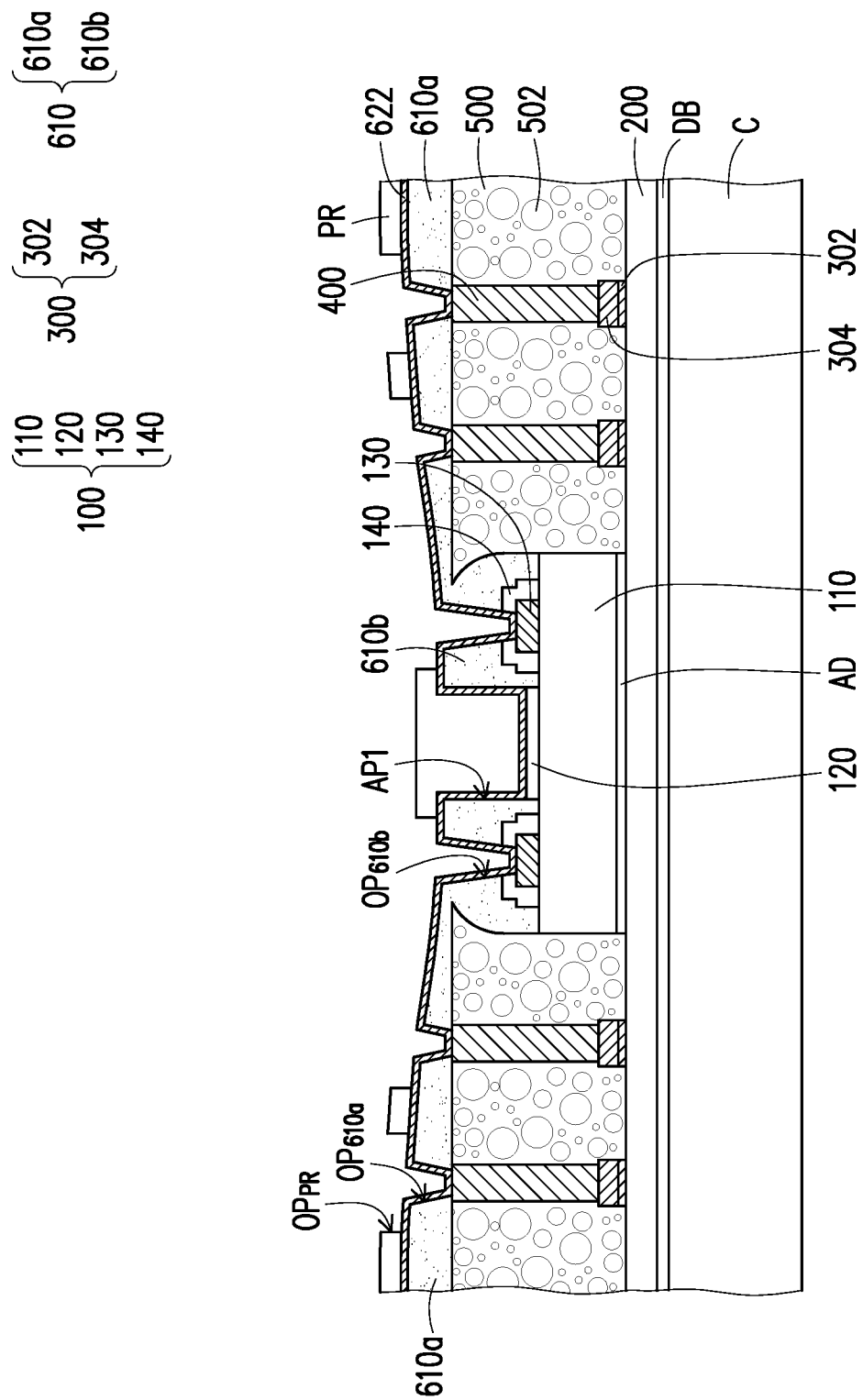

PACKAGE AND MANUFACTURING METHOD THEREOF

CROSS-REFERENCE TO RELATED APPLICATION

This application is a continuation application of and claims the priority benefit of a prior application Ser. No. 16/897,287, filed on Jun. 10, 2020, now allowed. The prior application Ser. No. 16/897,287 claims the priority benefit of U.S. provisional application Ser. No. 62/906,748, filed on Sep. 27, 2019. The entirety of each of the above-mentioned patent applications is hereby incorporated by reference herein and made a part of this specification.

BACKGROUND

The semiconductor industry has experienced rapid growth due to continuous improvements in the integration density of various electronic components (e.g., transistors, diodes, resistors, capacitors, ultrasonic sensors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
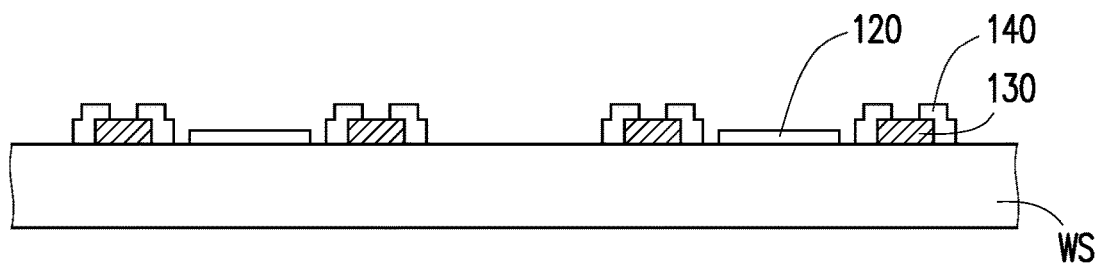
FIG. 1A to FIG. 1S are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
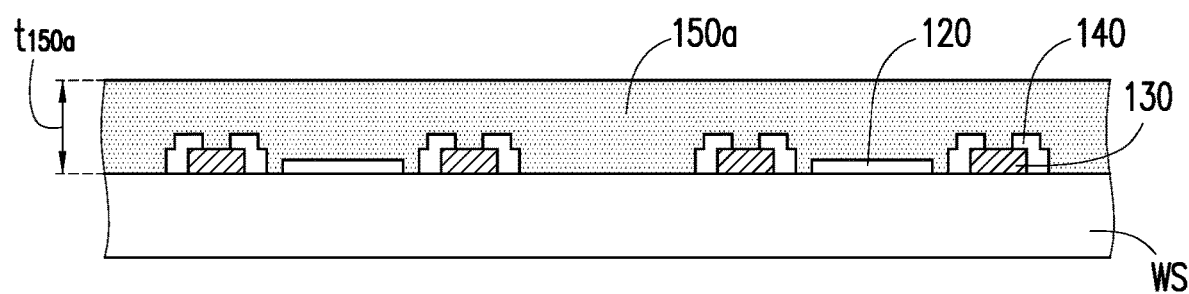
Figure 1C:
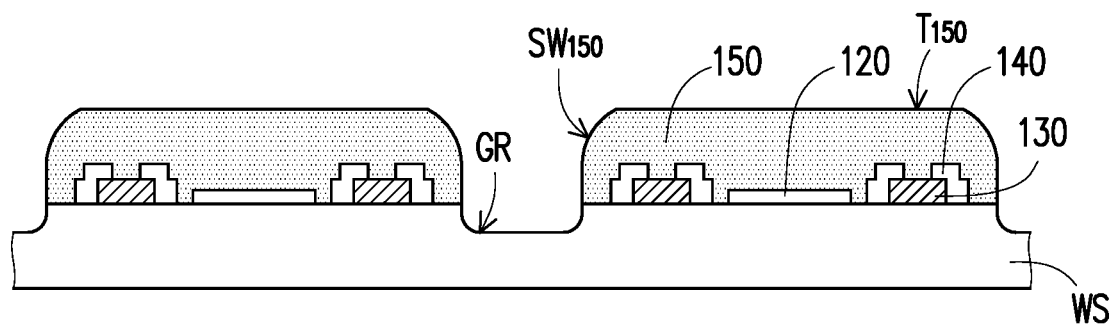
Figure 1D:
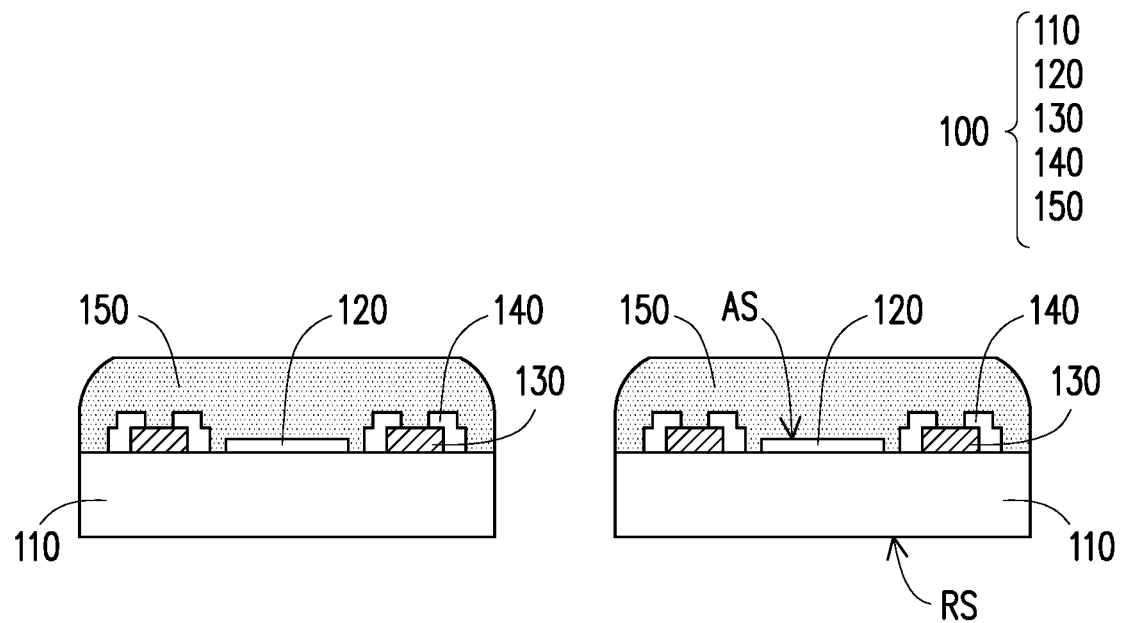
Figure 1G:
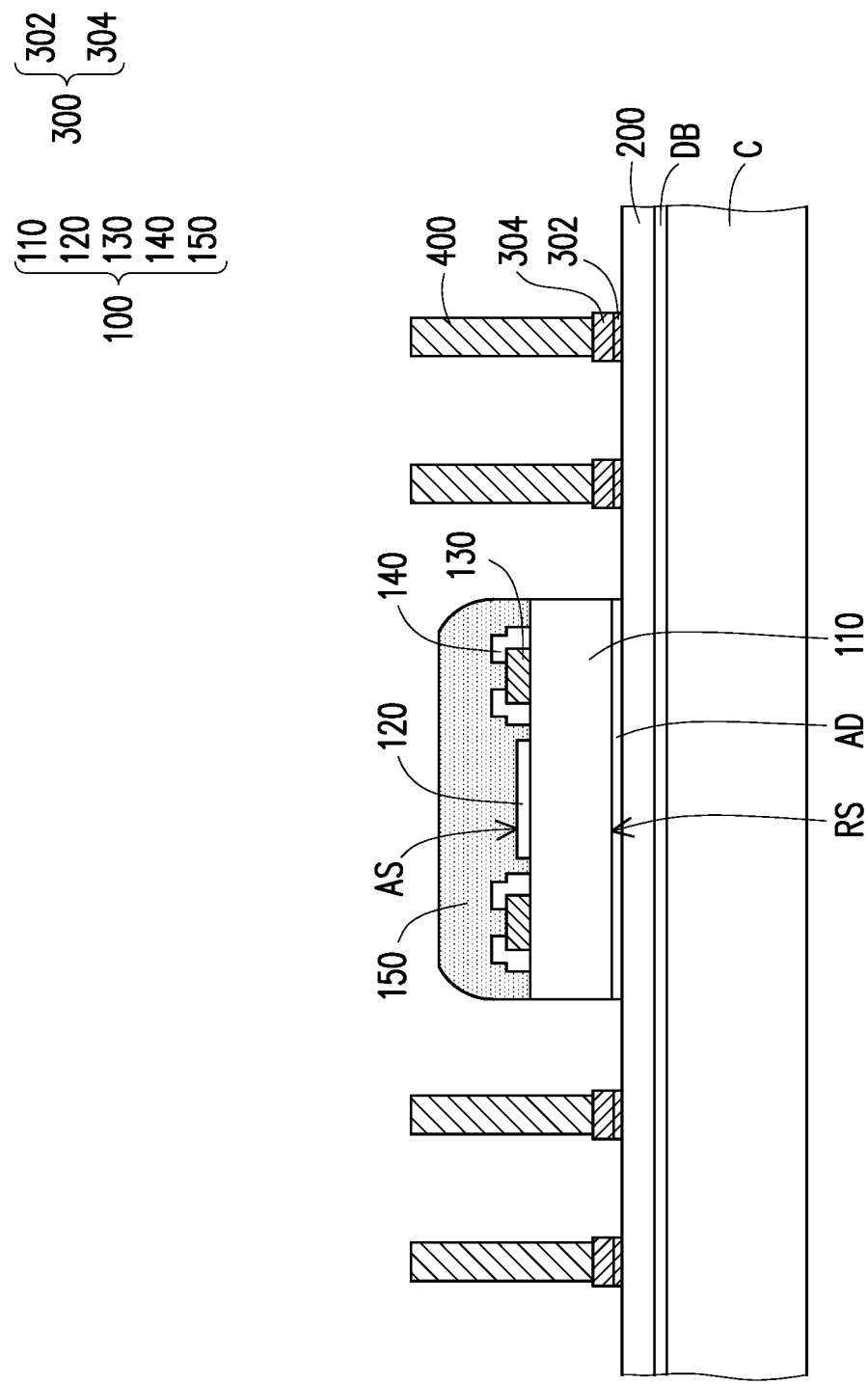
Figure 1H:
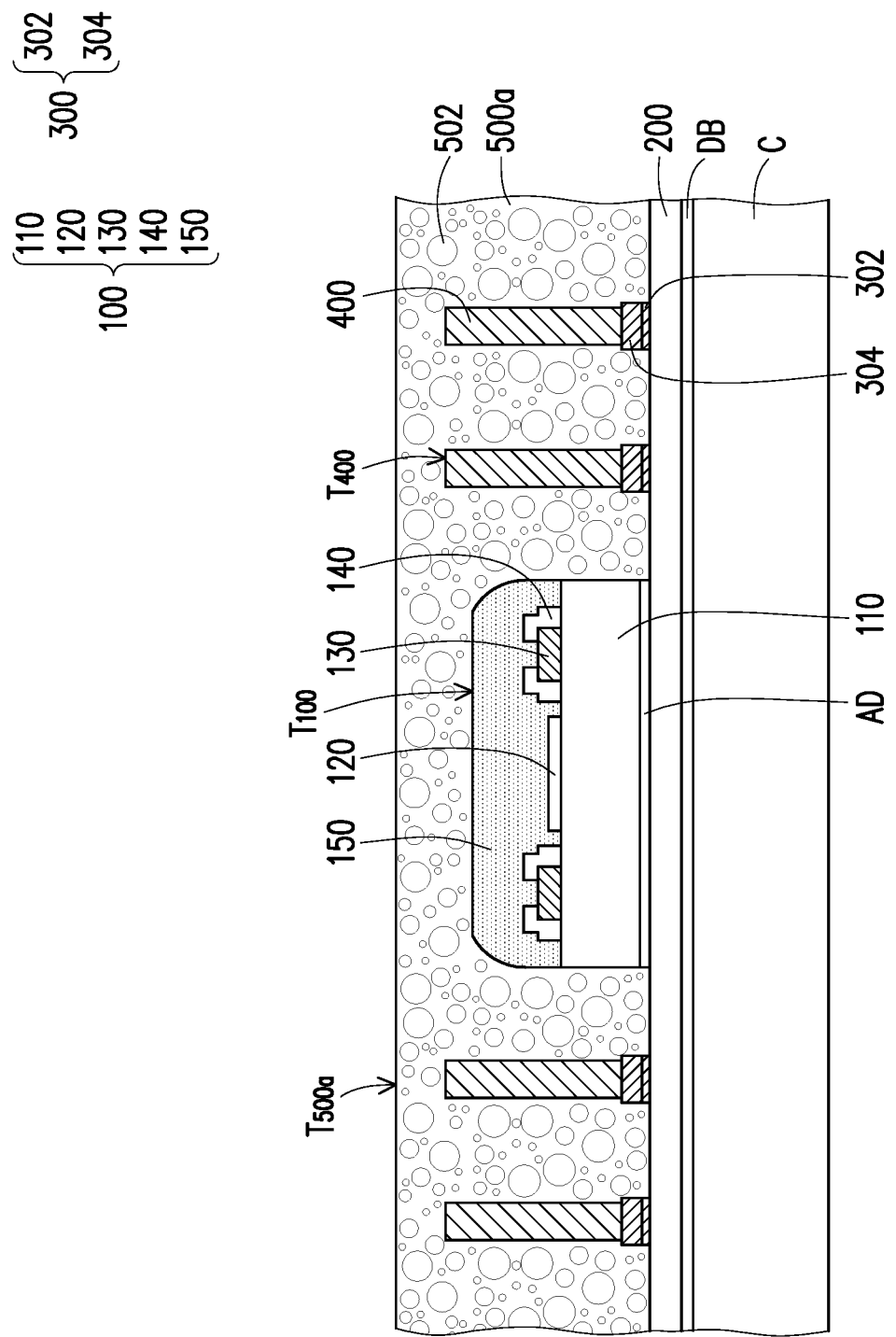
Figure 1I:
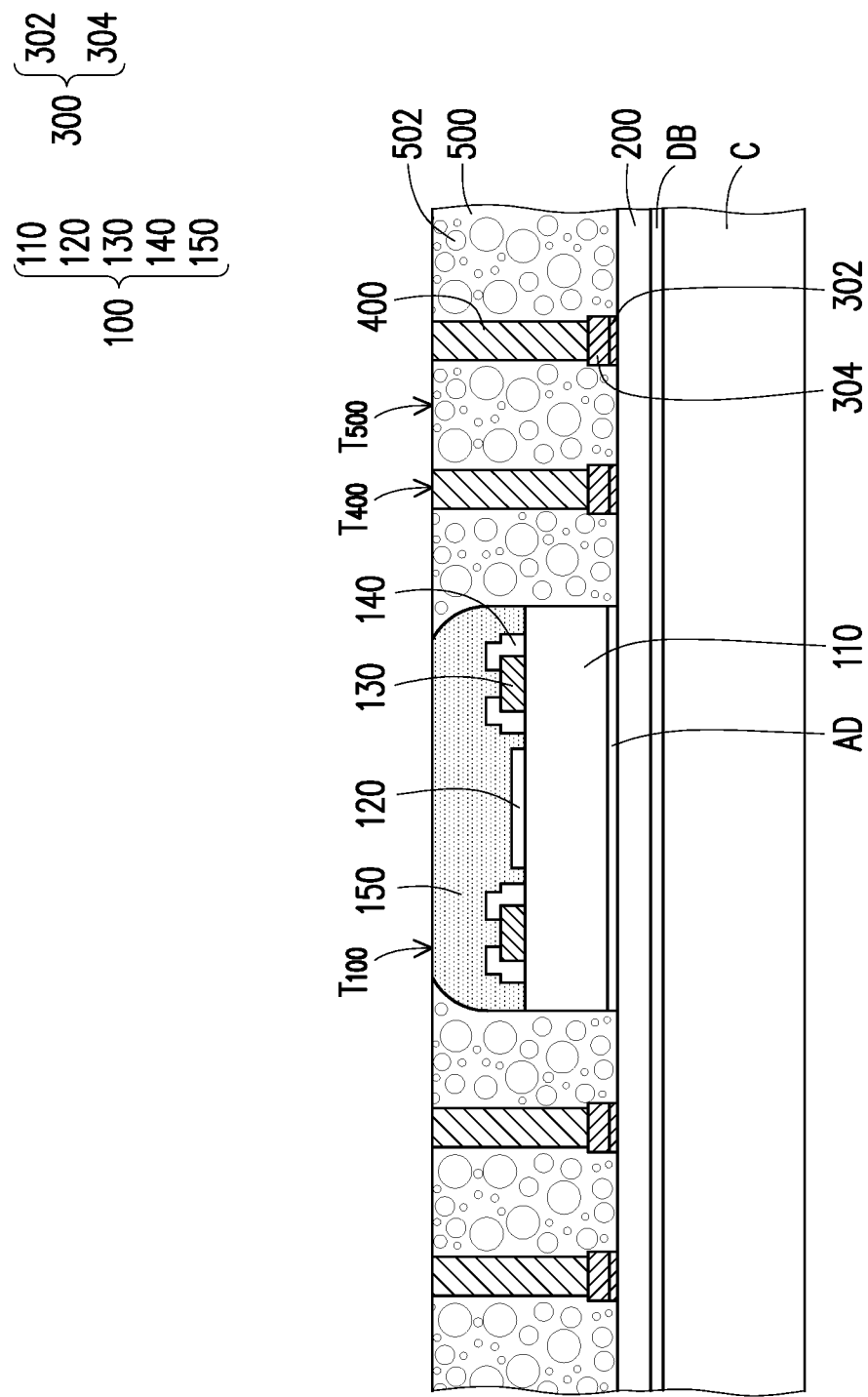
Figure 1J:
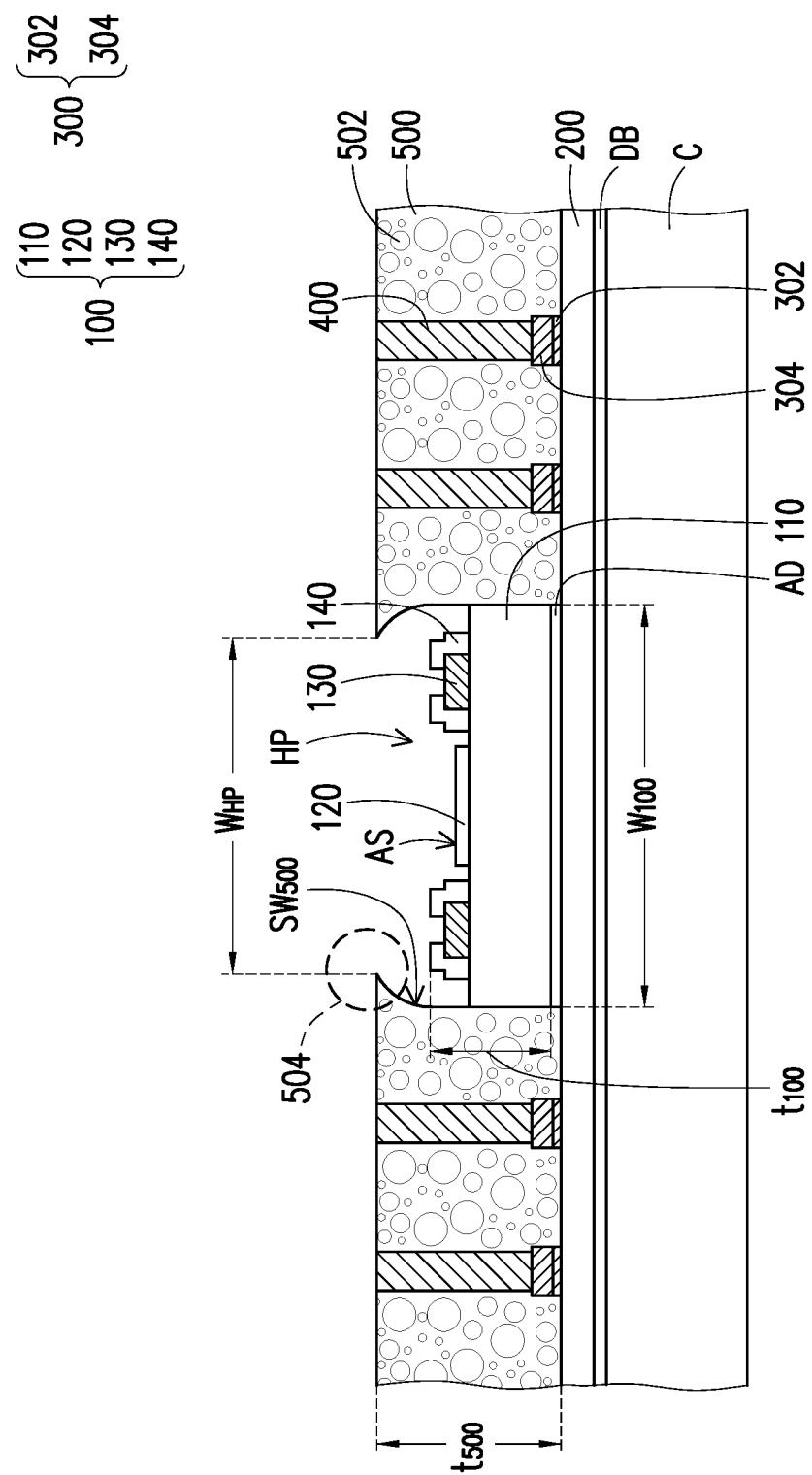
Figure 1K:
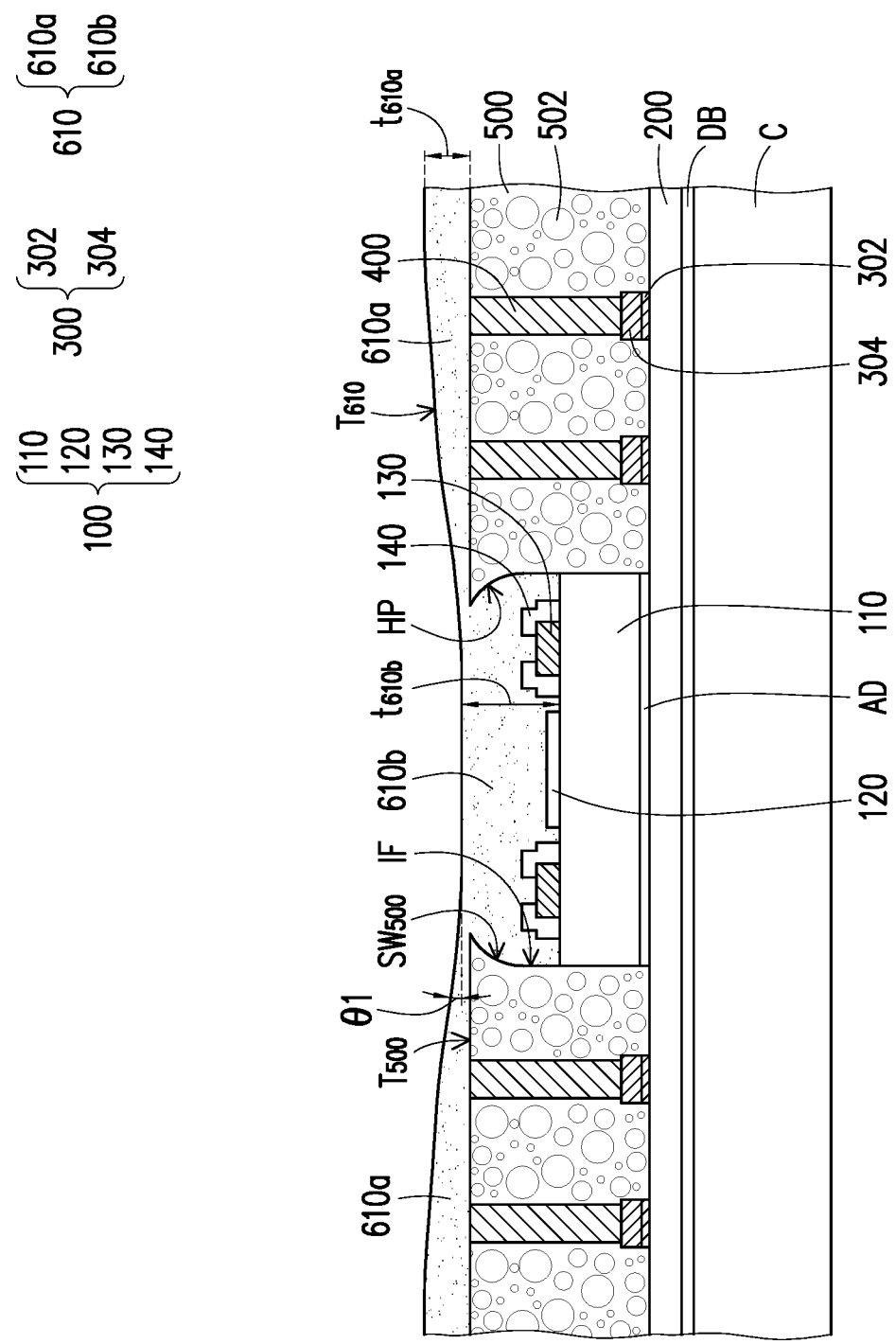
Figure 1L:
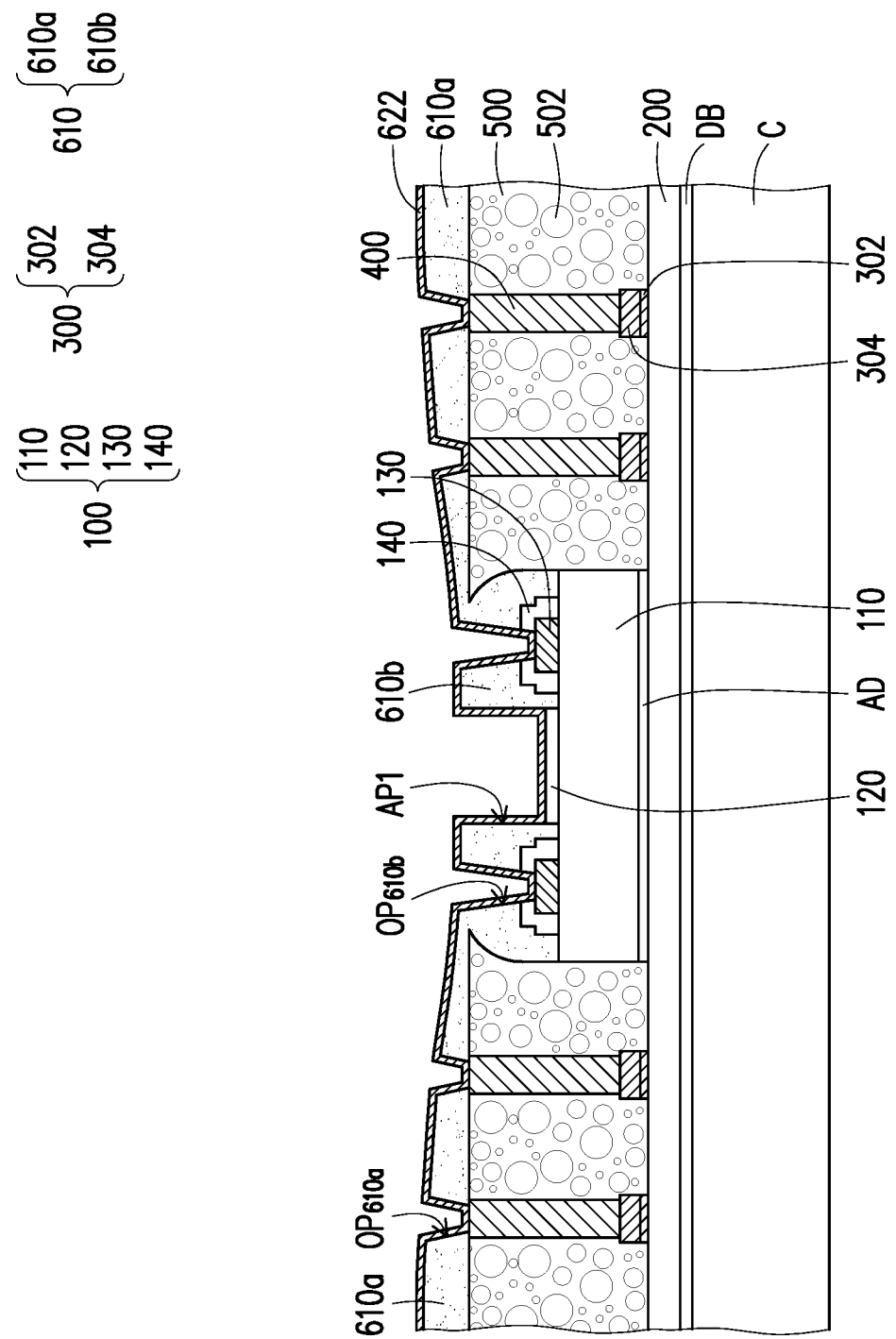
Figure 1N:
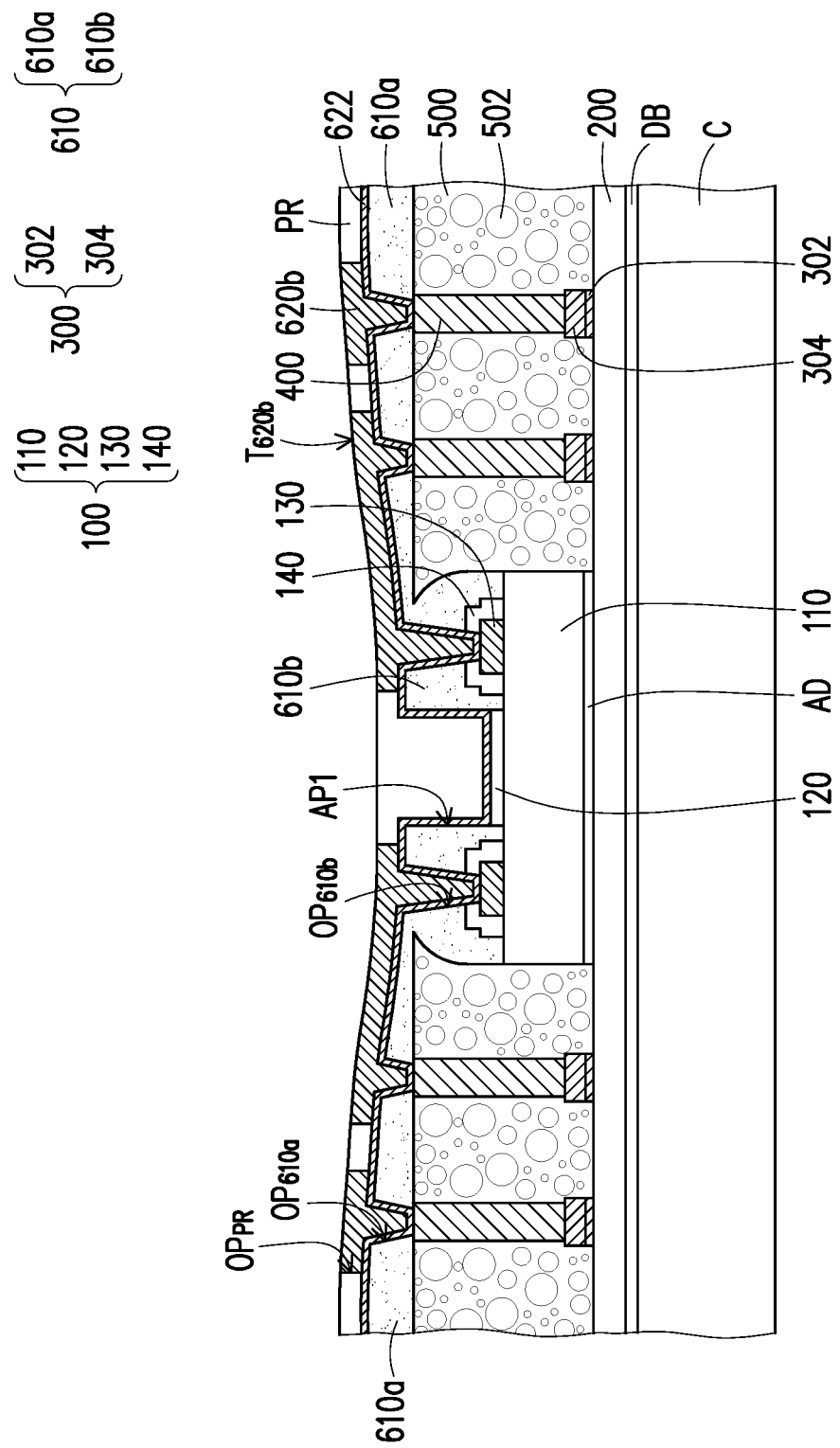
Figure 10:
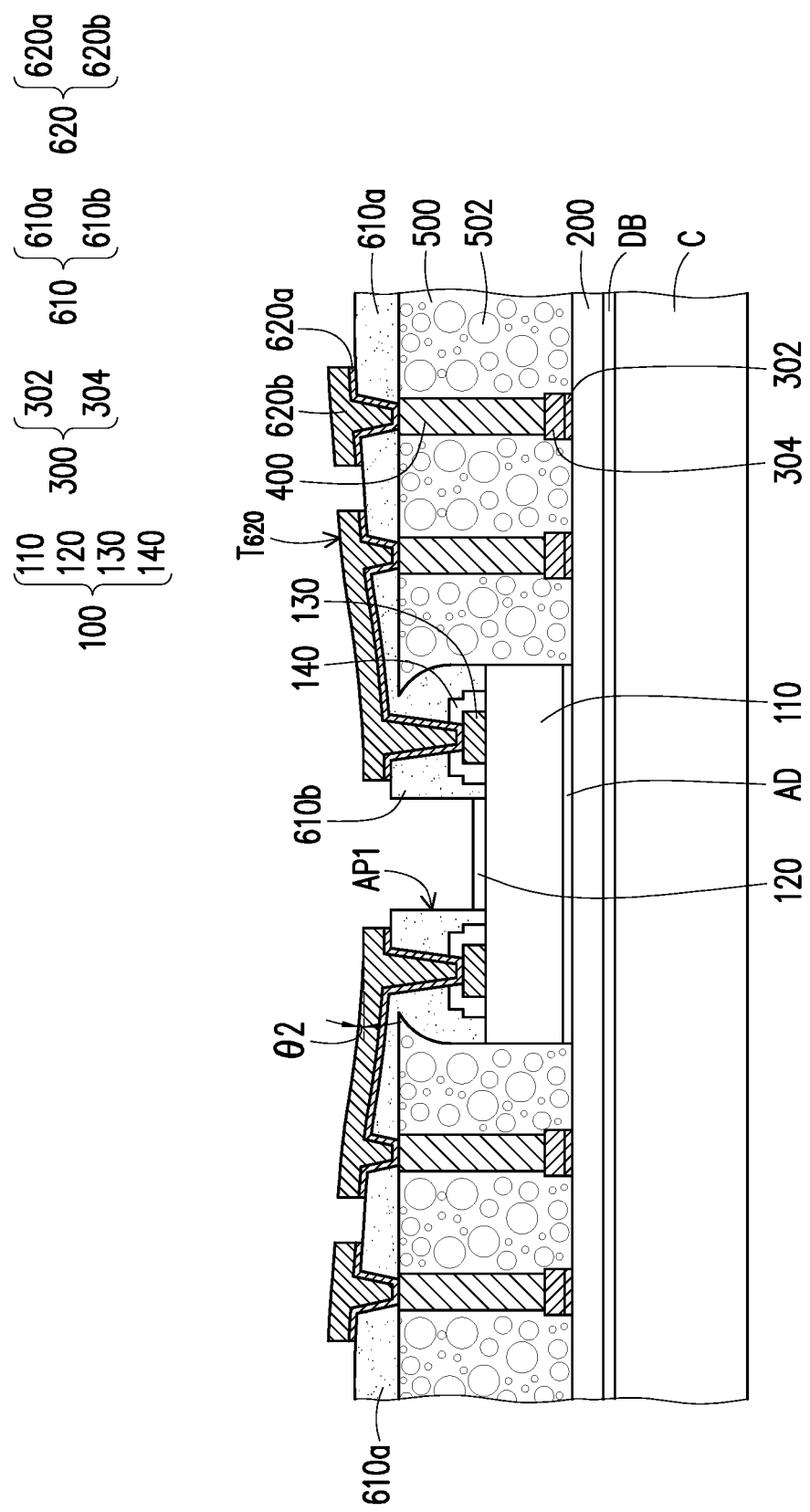
Figure 1P:
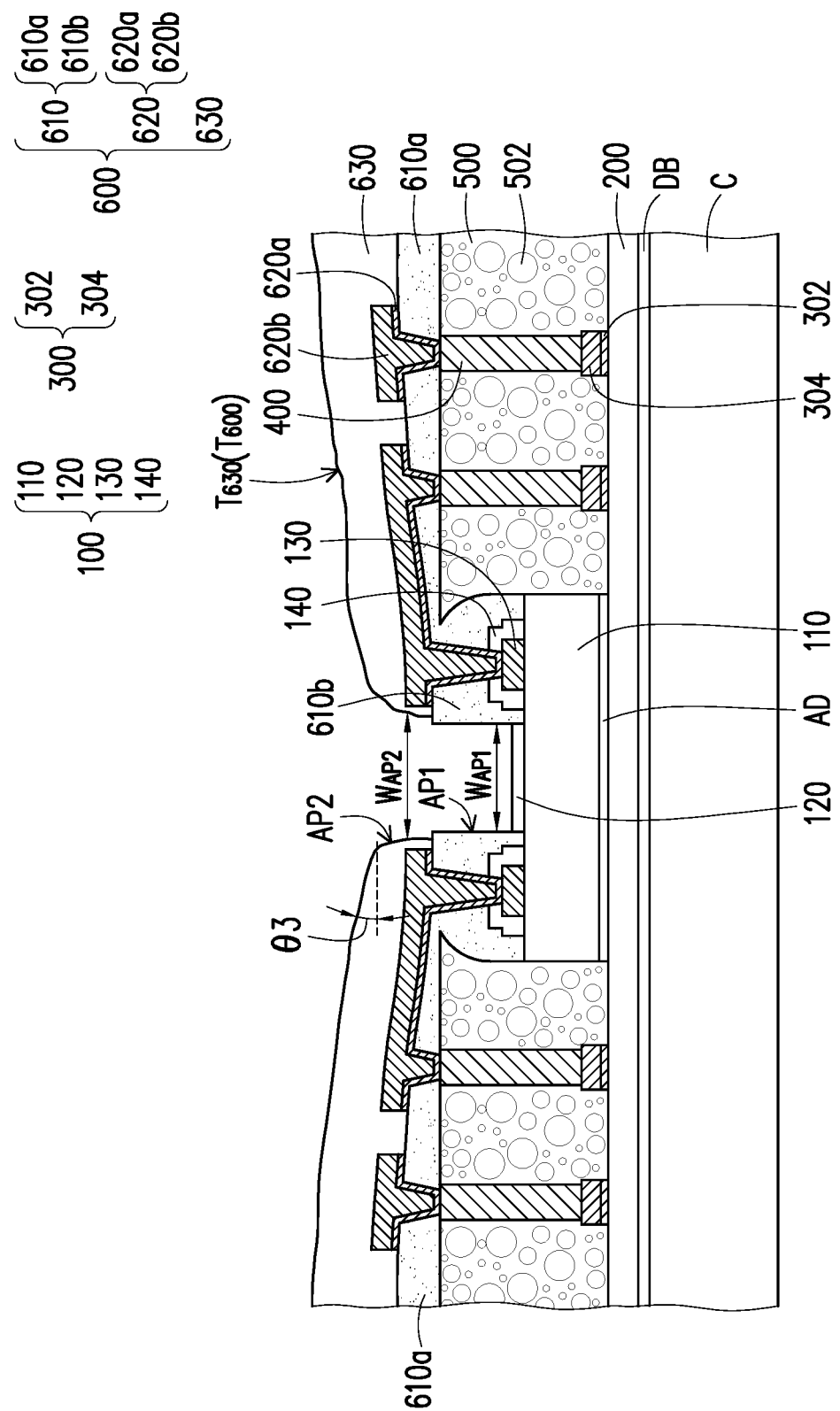
Figure 1Q:
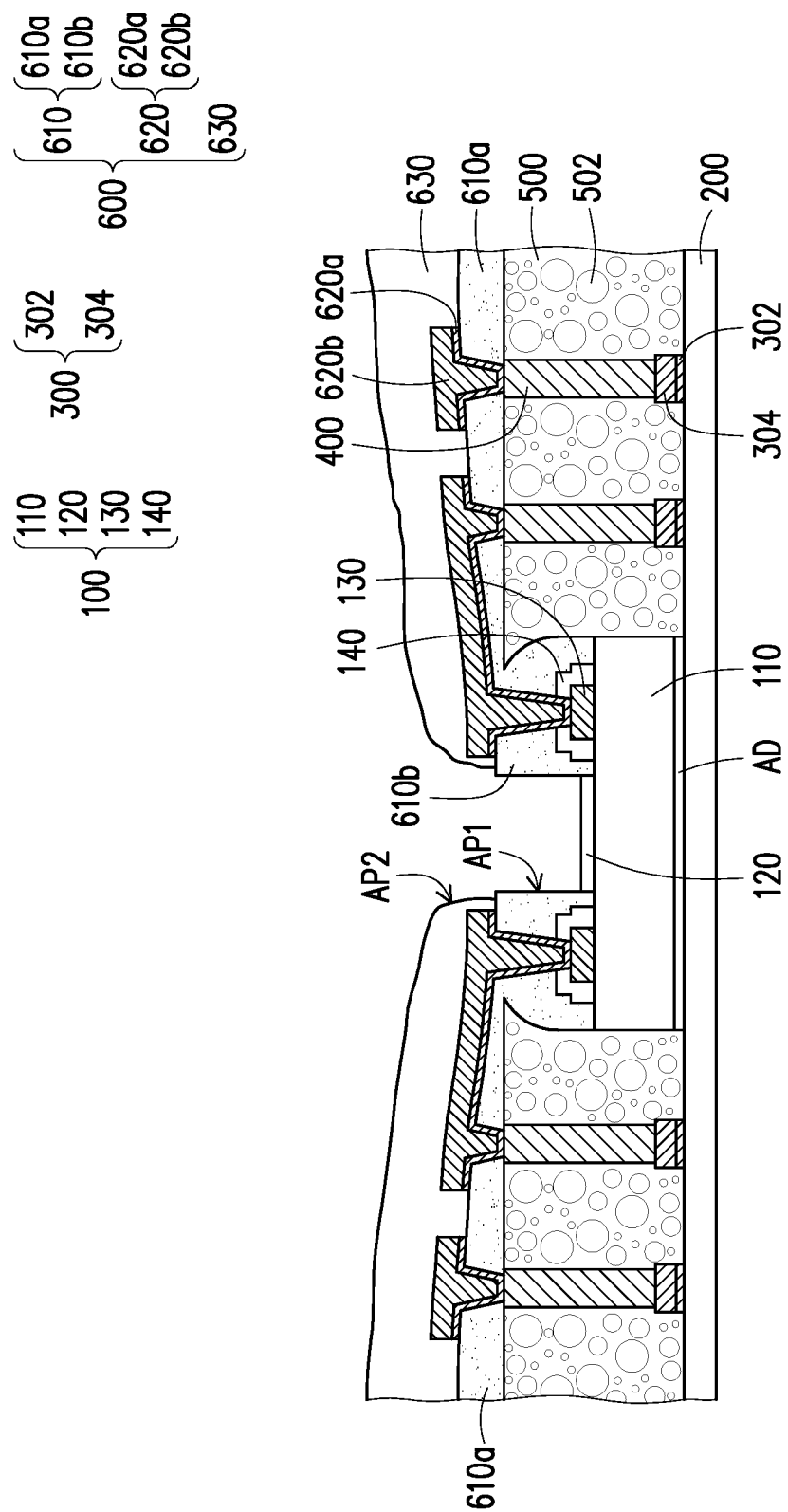
Figure 1R:
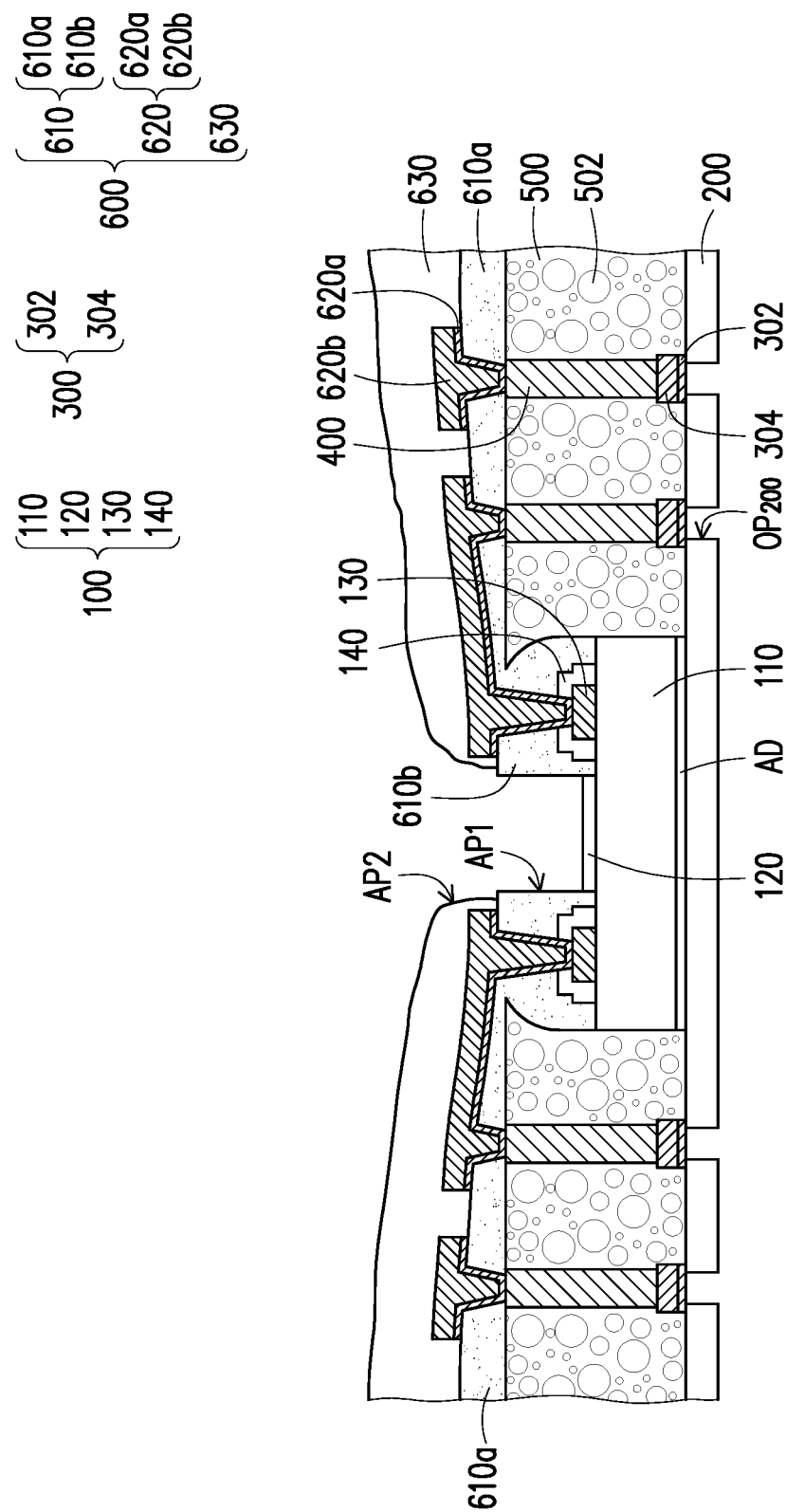
Figure 1S:
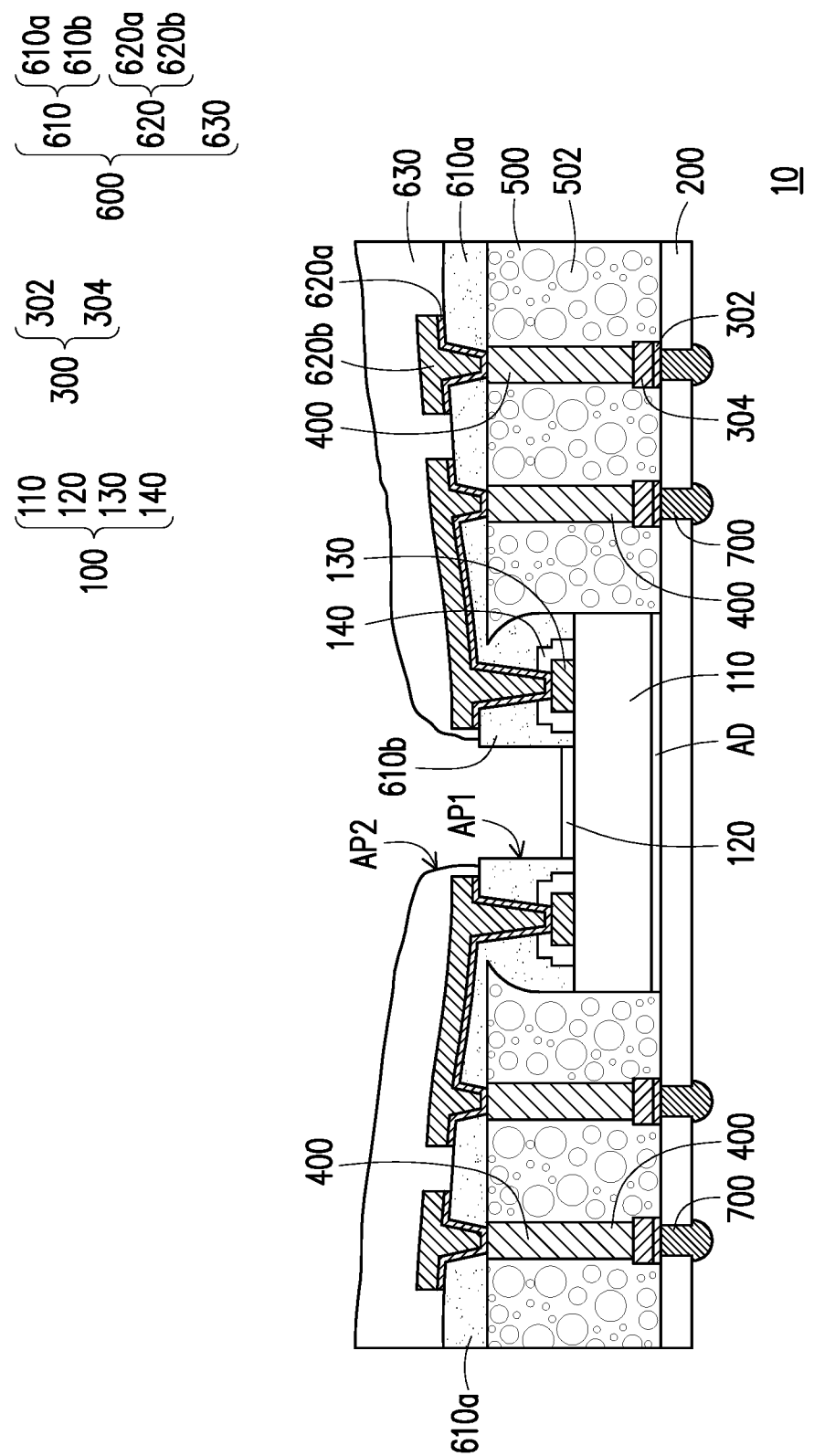

FIG. 1A to FIG. 1S are schematic cross-sectional views illustrating a manufacturing process of a package 10 in accordance with some embodiments of the disclosure. Referring to FIG. 1A, a semiconductor wafer WS is provided. In some embodiments, the semiconductor wafer WS may be made of elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In some embodiments, the semiconductor wafer WS includes active components (e.g., transistors or the like) and/or passive components (e.g., resistors, capacitors, inductors, or the like) formed therein.

As illustrated in FIG. 1A, a plurality of sensing components 120, a plurality of conductive pads 130, and a patterned passivation layer 140 are formed on the semiconductor wafer WS. In some embodiments, the sensing components 120 are disposed between adjacent conductive pads 130. For example, the conductive pads 130 surround the corresponding sensing component 120. In some embodiments, the sensing components 120 may be ultrasonic sensors which sense the vibration of air or sound. However, the disclosure is not limited thereto. In some alternative embodiments, the sensing components 120 may be photo sensors, fingerprint sensors, or the like. In some embodiments, a material of the conductive pads 130 includes aluminum, titanium, copper, nickel, tungsten, and/or alloys thereof. The conductive pads 130 may be formed by, for example, electroplating, deposition, and/or photolithography and etching. It should be noted that the number of the sensing components 120 and the number of the conductive pads 130 shown in FIG. 1A are merely exemplary illustrations, and the disclosure is not limited thereto. In some alternative embodiments, the number of the sensing components 120 and the number of the conductive pads 130 may be adjusted depending on the routing requirements.

In some embodiments, the patterned passivation layer 140 is formed on the semiconductor wafer WS and the conductive pads 130 to partially cover the conductive pads 130. For example, the patterned passivation layer 140 exposes at least a portion of each conductive pad 130 for future electrical connection. In some embodiments, the patterned passivation layer 140 may be a polymer layer having sufficient thickness to protect the conductive pads 130. In some embodiments, a material of the patterned passivation layer 140 includes polyimide, epoxy resin, acrylic resin, phenol resin, benzocyclobutene (BCB), polybenzoxazole (PBO), or any other suitable dielectric material. The patterned passivation layer 140, for example, may be formed by suitable fabrication techniques such as spin-on coating, chemical vapor deposition (CVD), plasma-enhanced chemical vapor deposition (PECVD), or the like.

Although FIG. 1A illustrated that the sensing components 120 are disposed on a top surface of the semiconductor wafer WS, the disclosure is not limited thereto. In some alternative embodiments, the sensing components 120 may be embedded in the semiconductor wafer WS while being coplanar with the top surface of the semiconductor wafer WS. That is, the sensing components 120 are exposed by the semiconductor wafer WS.

Referring to FIG. 1B, a sacrificial material layer 150a is formed over the semiconductor wafer WS to cover the sensing components 120, the conductive pads 130, and the patterned passivation layer 140. In some embodiments, a composition for the sacrificial material layer 150a includes a polymer, a solvent, and a plasticizer compound. In some embodiments, examples of the polymer include polyimide, polybenzoxazole, polyacrylate, or a combination thereof. In some embodiments, a content of the polymer ranges between 25 wt % and 35 wt % with respect to a total weight of the composition. In some embodiments, examples of the solvent include N-methyl-2-pyrrolidone (NMP), γ-Butyrolactone (GBL), ethyl lactate (EL), tetrahydrofuran (THF), dimethylformamide (DMF), or a combination thereof. In some embodiments, a content of the solvent ranges between 60 wt % and 80 wt % with respect to the total weight of the composition.

In some embodiments, the plasticizer compound has an aromatic ring structure. For example, the plasticizer compound includes di(2-ethylhexyl)phthalate (DEHP; also known as dioctyl phthalate (DOP); represented by the following formula (1-1)), di-n-cotyl phthalate (DNOP; represented by the following formula (1-2)), di-iso-nonyl phthalate (DINP; represented by the following formula (1-3)), di(2-propylheptyl)phthalate (DPHP; represented by the following formula (1-4)), dioctyl terephthalate (DOTP; represented by the following formula (1-5)), diisodecyl phthalate (DIDP; represented by the following formula (1-6)), dibutyl phthalate (DBP; represented by the following formula (1-7)), tris(2-ethylhexyl) trimellitate (TOTM; represented by the following formula (1-8)), diethyl phthalate (DEP; represented by the following formula (1-9)), or a combination thereof. In other words, the plasticizer compound includes at least one compound selected from the compounds represented by formula (1-1) to formula (1-9):

(1-1)

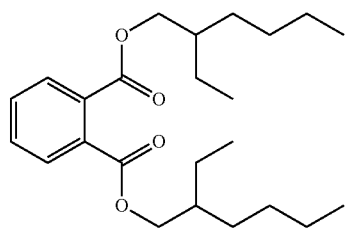

(1-2)

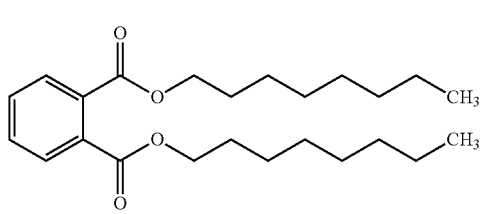

-continued (1-3)

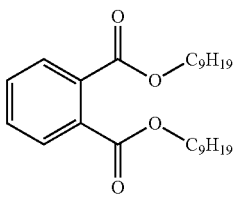

(1-4)

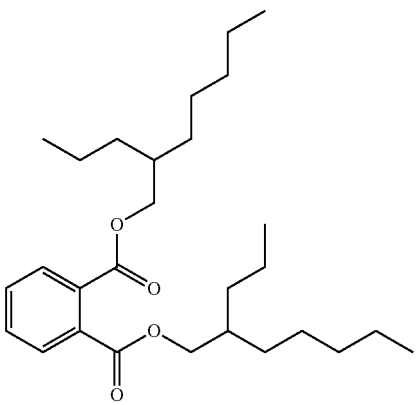

(1-5)

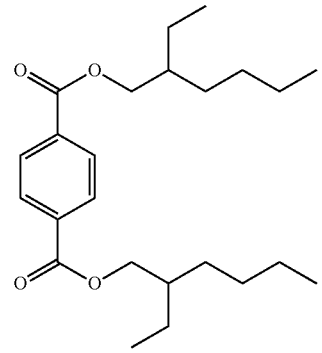

(1-6)

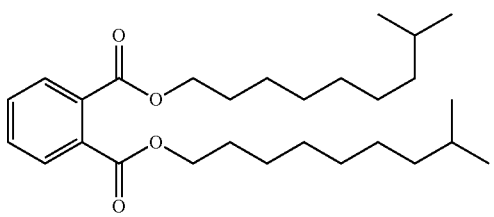

(1-7)

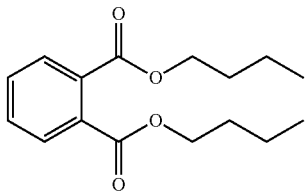

(1-8)

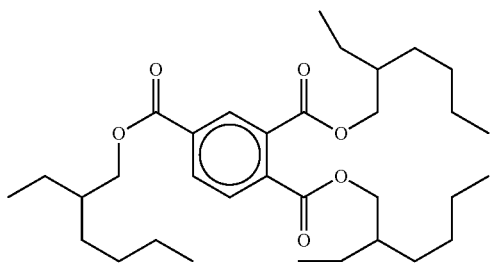

-continued

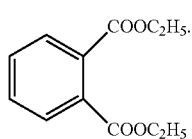

(1-9)

In some embodiments, a content of the plasticizer compound ranges between 1 wt % and 10 wt % with respect to the total weight of the composition. In some embodiments, a molecular weight of the plasticizer compound ranges between 200 and 2000.

In some embodiments, the composition for the sacrificial material layer 150a may optionally include a crosslinking agent. In some embodiments, examples of the crosslinking agent include tetraethylene glycol, dimethacrylate, or a combination thereof. When the composition includes the crosslinking agent, a crosslinking temperature of the composition may be greater than 200° C. and less than 230° C.

In some embodiments, the sacrificial material layer 150a is free of photo initiator. For example, the sacrificial material layer 150a is free of photo sensitizer. In some embodiments, the sacrificial material layer 150a is also free of polyamide. That is, the composition for the sacrificial material layer 150a does not include polyamide. In some embodiments, the sacrificial material layer 150a is formed to have a thickness $t_{150a}$ of 15 μm to 30 μm. In some embodiments, a glass transition temperature (Tg) of the sacrificial material layer 150a ranges between 243° C. and 255° C. On the other hand, a thermal decomposition temperature (Td) of the sacrificial material layer 150a ranges between 339° C. and 353° C. In some embodiments, a Young's modulus of the sacrificial material layer 150a ranges between 2.6 GPa and 3.0 GPa. Moreover, a tensile stress of the sacrificial material layer 150a ranges between 102 MPa and 155 MPa. In some embodiments, the composition mentioned above renders the sacrificial material layer 150a to have excellent adhesion to the semiconductor wafer WS, the sensing element 120, the conductive pads 130, and the patterned passivation layer 140.

Referring to FIG. 1B and FIG. 1C, a grooving process is performed on the structure illustrated in FIG. 1B. In some embodiments, during the grooving process, a portion of the sacrificial material layer 150a is removed to form a plurality of sacrificial films 150 over the semiconductor wafer WS. Meanwhile, a plurality of grooves GR is formed in the semiconductor wafer WS. In some embodiments, the grooving process includes a laser grooving process or the like. For example, a laser beam may be applied to the sacrificial material layer 150a and the semiconductor wafer WS to remove a portion of the sacrificial material layer 150a and a portion of the semiconductor wafer WS. In some embodiments, after the grooving process, each sacrificial film 150 has a substantially flat top surface $T_{150}$ and curved sidewalls $SW_{150}$.

Referring to FIG. 1C and FIG. 1D, a singulation process is performed on the semiconductor wafer WS to obtain a plurality of dies 100. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the singulation process is performed along the grooves GR. In some embodiments, during the singulation process, the semiconductor wafer WS is divided into a plurality of semiconductor substrates 110. That is, at this stage, each die 100 includes the semiconductor substrate 110, the sensing component 120, the conductive pads 130, the patterned passivation layer 140, and the sacrificial film 150. In some embodiments, the sacrificial film 150 is disposed over the semiconductor substrate 110 to protect the sensing component 120, the conductive pads 130, and the patterned passivation layer 140. In some embodiments, a top surface of the sensing component 120 and top surfaces of the conductive pads 130 may be collectively referred to as an active surface AS of the die 100. Meanwhile, a surface of the die 100 opposite to the active surface AS is referred to as a rear surface RS of the die 100.

Referring to FIG. 1E, a carrier substrate C having a de-bonding layer DB and a dielectric layer 200 formed thereon is provided. In some embodiments, the de-bonding layer DB is formed on a top surface of the carrier substrate C, and the de-bonding layer DB is located between the carrier substrate C and the dielectric layer 200. For example, the carrier substrate C may be a glass substrate and the de-bonding layer DB may be a light-to-heat conversion (LTHC) release layer formed on the glass substrate. However, the disclosure is not limited thereto. In some alternative embodiments, other suitable materials may be adapted for the carrier substrate C and the de-bonding layer DB.

In some embodiments, a material of the dielectric layer 200 includes polyimide, epoxy resin, acrylic resin, BCB, PBO, or any other suitable polymer-based dielectric material. The dielectric layer 200, for example, may be formed by suitable fabrication techniques such as spin-on coating, CVD, PECVD, or the like.

Referring to FIG. 1F, a plurality of seed layer patterns 302 and a plurality of conductive material patterns 304 are sequentially formed over the dielectric layer 200. In some embodiments, the seed layer patterns 302 and the conductive material patterns 304 may be formed by the following steps. First, a seed material layer (not shown) is blanketly and conformally formed over the dielectric layer 200. In some embodiments, the seed material layer is a composite layer formed by different materials. For example, the seed material layer may be constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials. In some embodiments, the seed material layer is formed by physical vapor deposition (PVD), sputtering, or other applicable methods. After the seed material layer is formed over the dielectric layer 200, a mask layer (not shown) is formed on the seed material layer. The mask layer has openings partially exposing the seed material layer. In some embodiments, the mask layer may be formed by a photosensitive material. For example, the mask layer may be a photoresist or a dry film. Thereafter, a conductive material layer (not shown) is filled into the openings of the mask layer. That is, the conductive material layer is formed on the portion of the seed material layer exposed by the openings of the mask layer. In some embodiments, the conductive material layer may be formed by a plating process followed by a grinding process. In some embodiments, the plating process is, for example, electro-plating, electroless-plating, immersion plating, or the like. On the other hand, the grinding process includes, for example, a mechanical grinding process, a chemical mechanical polishing (CMP) process, or the like. However, the disclosure is not limited thereto. In some alternative embodiments, the grinding process may be omitted. The conductive material layer include, for example, copper, copper alloys, or the like. Subsequently, the mask layer is removed through a stripping process, an etching process, and/or a cleaning process. Upon removal of the mask layer, a portion of the seed material layer is exposed. For example, the seed material layer not covered by the conductive material layer is exposed. Then, the exposed portion of the seed material layer may be removed through an etching process to form the seed layer patterns 302 and the conductive material patterns 304. In some embodiments, sidewalls of each seed layer pattern 302 is aligned with sidewalls of the corresponding conductive material pattern 304. In some embodiments, the seed layer patterns 302 and the conductive material patterns 304 may be collectively referred to as a redistribution structure 300. Although the redistribution structure 300 is illustrated as having one layer of seed layer patterns 302 and one layer of conductive material patterns 304 in FIG. 1F, the disclosure is not limited thereto. In some alternative embodiments, multiple layers of seed layer patterns 302 and multiple layers of conductive material patterns 304 may exist in the redistribution structure 300. Under this scenario, the redistribution structure 300 may further include a plurality of dielectric layers alternately stacked with the seed layer patterns 302 and the conductive material patterns 304.

Referring to FIG. 1G, the die 100 shown in FIG. 1D is placed over the carrier substrate C. For example, the die 100 is picked-and-placed onto the dielectric layer 200. In some embodiments, the die 100 is attached to the dielectric layer 200 through an adhesive layer AD. In other words, the rear surface RS of the die 100 is attached to the adhesive layer AD. On the other hand, the active surface AS of the die 100 faces upward. In some embodiments, the adhesive layer AD may include a die attach film (DAF). For simplicity, one die 100 is shown in FIG. 1G. However, it should be understood that multiple dies 100 may be placed over the carrier substrate C to arrange in an array.

As illustrated in FIG. 1G, a plurality of through insulating vias (TIV) 400 are formed over redistribution structure 300. For example, the TIVs 400 are directly in contact with the conductive material patterns 304. In some embodiments, the TIVs 400 surround the die 100. In some embodiments, a material of the TIVs 400 includes copper, copper alloys, or the like. For example, the TIVs 400 and the conductive material patterns 304 may be made of the same material. Alternatively, the TIVs 400 and the conductive material patterns 304 may be made of different materials. In some embodiments, the TIVs 400 are formed on the redistribution structure 300 through a plating process. For example, a seed layer (not shown) is first formed on top surfaces of the conductive material patterns 304. Thereafter, the TIVs 400 are plated onto the seed layer over the top surfaces of the conductive material patterns 304. However, the disclosure is not limited thereto. In some alternative embodiments, the TIVs 400 may be plated onto top surfaces of the conductive material patterns 304 while utilizing the seed layer patterns 302 as the seed layer. Under this scenario, the exposed portion of the seed material layer discussed in FIG. 1F is not removed prior to the formation of TIVs 400. That is, the TIVs 400 may be plated by utilizing the seed material layer discussed in FIG. 1F as a seed layer. After the TIVs 400 are formed, the exposed portion of the seed material layer is removed to form the seed layer patterns 302. In some embodiments, the plating process includes, electro-plating, electroless-plating, immersion plating, or the like. However, the disclosure is not limited thereto. In some alternative embodiments, the TIVs 400 may be formed by pick and place pre-fabricated TIVs onto the conductive material patterns 304. In some embodiments, a width/diameter of each TIV 400 is smaller than a width of the conductive material patterns 304. However, the disclosure is not limited thereto. In some alternative embodiments, the width/diameter of each TIV 400 may be substantially the same as the width of the conductive material patterns 304. In some embodiments, the TIVs 400 are formed prior to the placement of the die 100. However, the disclosure is not limited thereto. In some alternative embodiments, the placement of the die 100 may precede the formation of TIVs 400.

Referring to FIG. 1H, an encapsulation material 500a is formed over the dielectric layer 200 to encapsulate the die 100, the redistribution structure 300, the adhesive layer AD, and the TIVs 400. In some embodiments, the encapsulation material 500a is a molding compound, a molding underfill, a resin (such as epoxy), or the like. In some alternative embodiments, the encapsulation material 500a includes a photosensitive material such as PBO, polyimide, BCB, a combination thereof, or the like. In some embodiments, the encapsulation material 500a may be formed by a molding process, such as a compression molding process. In some embodiments, the encapsulation material 500a further includes fillers 502 embedded therein to enhance the mechanical strength thereof. In some embodiments, the fillers 502 include, for example, particles of $Al_2O_3$, $SiO_2$, $TiO_2$, and/or the like. In some embodiments, a diameter of the fillers 502 may be smaller than about 10 μm, and may be smaller than about 5 μm. In some embodiments, the encapsulation material 500a may be free of filler. As illustrated in FIG. 1H, the die 100 and the TIVs 400 are not revealed and are well protected by the encapsulation material 500a. In other words, a top surface $T_{500a}$ of the encapsulation material 500a is located at a level height higher than a top surface $T_{100}$ of the die 100 and top surfaces $T_{400}$ of the TIVs 400. As mentioned above, the composition for the sacrificial film 150 includes plasticizer. When the plasticizer is added in a specific amount, the plasticizer is able to aid the sacrificial film 150 to sustain the process for forming the encapsulation material 500a without deformation. For example, when the content of the plasticizer is less than 3 wt % with respect to the total weight of the composition, the sacrificial film 150 would not deform after the formation of the encapsulation material 500a. In other words, after the formation of the encapsulation material 500a, the shape of the sacrificial film 150 is not altered.

Referring to FIG. 1H and FIG. 1I, the encapsulation material 500a is grinded until the top surface $T_{100}$ of the die 100 and the top surfaces $T_{400}$ of the TIVs 400 are exposed. In other words, the encapsulation material 500a is grinded until the sacrificial film 150 and the TIVs 400 are exposed. After the encapsulation material 500a is grinded, an encapsulant 500 is formed over the dielectric layer 200 to laterally encapsulate the die 100, the adhesive layer AD, the redistribution structure 300, and the TIVs 400. In some embodiments, the encapsulation material 500a is grinded by a mechanical grinding process and/or a CMP process. In some embodiments, after the top surface $T_{100}$ of the die 100 and the top surfaces $T_{400}$ of the TIVs 400 are revealed, the grinding process may continue such that portions of the sacrificial film 150 and portions of the TIVs 400 are slightly grinded as well. As illustrated in FIG. 1I, after the grinding process, a top surface $T_{500}$ of the encapsulant 500 is substantially coplanar with the top surface $T_{100}$ of the die 100 and the top surfaces $T_{400}$ of the TIVs 400. As mentioned above, the composition for the sacrificial film 150 includes specific ingredients used in a specific amount. In some embodiments, the specific ingredients in the specific amount are able to provide sufficient mechanical strength for the sacrificial film 150 to withstand the grinding process.

Referring to FIG. 1I and FIG. 1J, the sacrificial film 150 of the die 100 is removed to form a hollow portion HP in the encapsulant 500. In some embodiments, the sacrificial film 150 is removed through a wet process. For example, the sacrificial film 150 may be removed by solutions utilized in a stripping process. In some embodiments, after the sacrificial film 150 is removed, the die 100 includes the semiconductor substrate 110, the sensing component 120, the conductive pads 130, and the patterned passivation layer 140. That is, after removal of the sacrificial film 150, a thickness two of the die 100 is smaller than a thickness $t_{500}$ of the encapsulant 500. In some embodiments, after removal of the sacrificial film 150, the active surface AS of the die 100 is exposed to the hollow portion HP. In some embodiments, with the addition of the plasticizer compounds into the composition for the sacrificial film 150, the brittleness and the rigidity of the polymer would be reduced. For example, the plasticizer compounds are able to penetrate inside of the polymer matrix to reduce the cohesive forces between polymers, so as to increase the free volume. As such, the diffusion of elements from the sacrificial film 150 to the encapsulant 500 may be prevented, and the sacrificial film 150 may be easily removed without having residues left on the encapsulant 500. In other words, after the sacrificial film 150 is removed, the encapsulant 500 is not deformed, and the contour of the encapsulant 500 is maintained. As mentioned above, the sacrificial film 150 has curved sidewalls $SW_{150}$. Since the sidewalls $SW_{500}$ of the encapsulant 500 follow the contour of the sacrificial film 150, the sidewalls $SW_{500}$ of the encapsulant 500 are also curved. For example, as illustrated in FIG. 1J, the encapsulant 500 has a protruding portion 504 having a sharp tip. In some embodiments, the protruding portion 504 protrudes horizontally away from the TIVs 400. That is, the protruding portion 504 protrudes horizontally toward a point directly above a center of the die 100. In some embodiments, since the hollow portion HP is formed by removing the sacrificial film 150, the contour of the hollow portion HP is substantially identical to the contour of the sacrificial film 150. As illustrated in FIG. 1J, a minimum width $W_{HP}$ of the hollow portion HP is smaller than a width $W_{100}$ of the die 100. That is, an opening area of the encapsulant 500 viewing from a top surface of the encapsulant 500 (i.e. the area of the hollow portion HP viewing from the top surface of the encapsulant 500) is smaller than an openings area of the encapsulant 500 viewing from a bottom surface of the encapsulant 500 (i.e. the area of the die 100 viewing from the bottom surface of the encapsulant 500).

Referring to FIG. 1J and FIG. 1K, a first dielectric layer 610 is formed on the die 100, the TIVs 400, and the encapsulant 500. For example, a first portion 610a of the first dielectric layer 610 is disposed on the TIVs 400 and the encapsulant 500 while a second portion 610b of the first dielectric layer 610 fills into the hollow portion HP to cover the die 100. That is, the first portion 610a of the first dielectric layer 610 is on the TIVs 400 and the encapsulant 500 while the second portion 610b of the first dielectric layer 610 is on the die 100. In some embodiments, a maximum thickness $t_{610a}$ of the first portion 610a of the first dielectric layer 610 is smaller than a maximum thickness $t_{610b}$ of the second portion 610b of the first dielectric layer 610. In some embodiments, a material of the first dielectric layer 610 includes polyimide, epoxy resin, acrylic resin, phenol resin, BCB, PBO, or any other suitable polymer-based dielectric material. The first dielectric layer 610, for example, may be formed by suitable fabrication techniques such as spin-on coating, CVD, PECVD, or the like. In some embodiments, the existence of the hollow portion HP would cause the first dielectric layer 610 to have a top surface $T_{610}$ that is not flat. For example, the top surface $T_{610}$ of the first dielectric layer 610 is slanted. As illustrated in FIG. 1K, the top surface $T_{610}$ of the first dielectric layer 610 forms a ramp toward the point directly above the center of the die 100. In some embodiments, the top surface $T_{610}$ of the first dielectric layer 610 has a slope ranging between 50° to 85°. That is, the top surface $T_{610}$ of the first dielectric layer 610 and a virtual line extending horizontally form an included angle θ1 of 50° to 85°, as shown in FIG. 1K.

As illustrated in FIG. 1K, the first dielectric layer 610 covers the top surface $T_{500}$ and a portion of the sidewalls $SW_{500}$ of the encapsulant 500. Since the first dielectric layer 610 fills into the hollow portion HP, an interface IF between a portion of the sidewalls $SW_{500}$ of the encapsulant 500 and the first dielectric layer 610 would follow the contour of the sidewalls $SW_{500}$ of the encapsulant 500. In other words, the interface IF between a portion of the sidewalls $SW_{500}$ of the encapsulant 500 and the first dielectric layer 610 is curved.

Referring to FIG. 1L, the first dielectric layer 610 is patterned to form a plurality of openings $OP_{610a}$, a plurality of openings $OP_{610b}$, and a first aperture AP1. In some embodiments, the first dielectric layer 610 may be patterned through a photolithography process and an etching process. In some embodiments, the first portion 610a of the first dielectric layer 610 has the openings $OP_{610a}$, and the second portion 610b of the first dielectric layer 610 has the openings $OP_{610b}$ and the first aperture AP1. In some embodiments, the openings $OP_{610a}$ expose at least a portion of each TIV 400. On the other hand, the openings $OP_{610b}$ expose at least a portion of each conductive pad 130 of the die 100. Moreover, the first aperture AP1 exposes the sensing component 120 of the die 100.

After the openings $OP_{610a}$, the openings $OP_{610b}$, and the first aperture AP1 are formed, a seed material layer 622 is conformally formed over the first dielectric layer 610. In other words, the seed material layer 622 extends into the openings $OP_{610a}$, the openings $OP_{610b}$, and the first aperture AP1 to be in direct contact with the TIVs 400, the conductive pads 130, and the sensing components 120. In some embodiments, the seed material layer 622 is a composite layer formed by different materials. For example, the seed material layer 622 may be constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials. In some embodiments, the seed material layer 622 is formed by PVD, sputtering, or other application methods. In some embodiments, the seed material layer 622 follows the profile of the underlying first dielectric layer 610. In other words, at least a portion of a top surface of the seed material layer 622 is slanted.

Referring to FIG. 1M, a photoresist layer PR is formed on the seed material layer 622. In some embodiments, the photoresist layer PR has a plurality of openings $OP_{PR}$. In some embodiments, the openings $OP_{PR}$ are formed through a photolithography process. The openings $OP_{PR}$ expose the underlying seed material layer 622. For example, the openings $OP_{PR}$ expose the seed material layer 622 located inside of the openings $OP_{610a}$, $OP_{610b}$ and the seed material layer 622 in proximity of the openings $OP_{610a}$, $OP_{610b}$. On the other hand, the photoresist layer PR covers the first aperture AP1.

Referring to FIG. 1N, a plurality of conductive material patterns 620b is formed on the seed material layer 622 and in the openings $OP_{PR}$. In some embodiments, a material of the conductive material patterns 620b includes aluminum, titanium, copper, nickel, tungsten, and/or alloys thereof. In some embodiments, the conductive material patterns 620b may be formed through electro-plating, electroless-plating, immersion plating, or the like. As illustrated in FIG. 1N, the conductive material patterns 620b follow the profiles of the top surfaces of the underlying first dielectric layer 610 and the seed material layer 622. In other words, top surfaces $T_{620b}$ of the conductive material patterns 620b are slanted. As illustrated in FIG. 1N, the top surfaces $T_{620b}$ of the conductive material patterns 620b form ramps toward the point directly above the center of the die 100.

Referring to FIG. 1N and FIG. 1O, the photoresist layer PR is removed. In some embodiments, the photoresist layer PR is removed through a stripping process, an etching process, and/or a cleaning process. Subsequently, the seed material layer 622 exposed by the conductive material patterns 620b is removed to form a plurality of seed layer patterns 620a underneath the conductive material patterns 620b. In some embodiments, the exposed portion of the seed material layer 622 may be removed through an etching process. In some embodiments, since the photoresist layer PR is being removed sufficiently, the conductive material patterns 620b may serve as a mask for partially removing the seed material layer 622. As a result, contours of the seed layer patterns 620a are identical to the contours of the conductive material patterns 620b. For example, sidewalls of each seed layer pattern 620a is aligned with sidewalls of the corresponding conductive material pattern 620b. In some embodiments, the seed layer patterns 620a and the conductive material patterns 620b may be collectively referred to as conductive patterns 620. That is, the conductive patterns 620 are formed on the first dielectric layer 610. In some embodiments, the conductive patterns 620 are electrically connected to the conductive pads 130 of the die 100 and the TIVs 400. As illustrated in FIG. 1O, the conductive patterns 620 follow the profile of the top surface of the underlying first dielectric layer 610. In other words, top surfaces $T_{620}$ of the conductive patterns 620 are slanted. As illustrated in FIG. 1O, the top surfaces $T_{620}$ of the conductive patterns 620 form ramps toward the point directly above the center of the die 100. In some embodiments, the top surfaces $T_{620}$ of the conductive patterns 620 have a slope ranging between 50° to 85°. That is, the top surfaces $T_{620}$ of the conductive patterns 620 and a virtual line extending horizontally form an included angle θ2 of 50° to 85°, as shown in FIG. 1O.

Referring to FIG. 1P, a second dielectric layer 630 is formed on the first dielectric layer 610 to cover the conductive patterns 620. In other words, the conductive patterns 620 are sandwiched between the first dielectric layer 610 and the second dielectric layer 630. In some embodiments, a material of the second dielectric layer 630 includes polyimide, epoxy resin, acrylic resin, phenol resin, BCB, PBO, or any other suitable polymer-based dielectric material. The second dielectric layer 630, for example, may be formed by suitable fabrication techniques such as spin-on coating, CVD, PECVD, or the like. In some embodiments, the second dielectric layer 630 has a second aperture AP2 exposing the sensing component 120 of the die 100 and the first aperture AP1 of the first dielectric layer 610. In other words, a size of the second aperture AP2 is larger than a size of the first aperture AP1. For example, as illustrated in FIG. 1P, a width $W_{AP2}$ of the second aperture AP2 is larger than a width $W_{AP1}$ of the first aperture AP1. In some embodiments, the first dielectric layer 610, the conductive patterns 620, and the second dielectric layer 630 are collectively referred to as a redistribution structure 600. In other words, the redistribution structure 600 is formed over the die 100, the TIVs 400, and the encapsulant 500. In some embodiments, the redistribution structure 600 has an opening (the first aperture AP1 and the second aperture AP2) exposing the sensing component 120 of the die 100. In some embodiments, the second dielectric layer 630 follows the profiles of the top surfaces of the underlying first dielectric layer 610 and the conductive patterns 620. In other words, a top surface $T_{630}$ of the second dielectric layer 630 (a top surface $T_{600}$ of the redistribution structure 600) is slanted. As illustrated in FIG. 1P, the top surface $T_{630}$ of the second dielectric layer 630 (the top surface $T_{600}$ of the redistribution structure 600) forms a ramp toward the point directly above the center of the die 100. In some embodiments, the top surface $T_{630}$ of the second dielectric layer 630 (the top surface $T_{600}$ of the redistribution structure 600) has a slope ranging between 50° to 85°. That is, the top surface $T_{630}$ of the second dielectric layer 630 and a virtual line extending horizontally form an included angle θ3 of 50° to 85°, as shown in FIG. 1P. In some embodiments, the top surface $T_{600}$ of the redistribution structure 600 has a roughness ranging between 0.002 μm and 0.035 μm.

Referring to FIG. 1P and FIG. 1Q, the dielectric layer 200 is de-bonded from the de-bonding layer DB such that the dielectric layer 200 is separated from the carrier substrate C. That is, the de-bonding layer DB and the carrier substrate C are removed. In some embodiments, the de-bonding layer DB (e.g., the LTHC release layer) may be irradiated by an UV laser such that the dielectric layer 200 may be peeled off from the carrier C.

Referring to FIG. 1R, the dielectric layer 200 is patterned to form a plurality of contact openings $OP_{200}$ partially exposing the redistribution structure 300. For example, the contact openings $OP_{200}$ of the dielectric layer 200 expose the seed layer patterns 302 of the redistribution structure 300. In some embodiments, the contact openings $OP_{200}$ of the dielectric layer 200 are formed by a laser drilling process, a mechanical drilling process, or other suitable processes.

Referring to FIG. 1R and FIG. 1S, after the contact openings $OP_{200}$ are formed in the dielectric layer 200, a plurality of conductive terminals 700 are formed in the contact openings $OP_{200}$ such that the conductive terminals 700 are electrically connected to the TIVs 400 through the redistribution structure 300. That is, the conductive terminals 700 are formed over the encapsulant 500 opposite to the redistribution structure 600. In some embodiments, the conductive terminals 700 are, for example, solder balls, ball grid array (BGA) balls, or controlled collapse chip connection (C4) bumps. In some embodiments, the conductive terminals 700 are made of a conductive material with low resistivity, such as Sn, Pb, Ag, Cu, Ni, Bi, or an alloy thereof. After the conductive terminals 700 are formed, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes.

In accordance with some embodiments of the disclosure, a composition for a sacrificial film includes a polymer, a solvent, and a plasticizer compound having an aromatic ring structure. The plasticizer compound includes at least one compound selected from the compounds represented by formula (1-1) to formula (1-9):

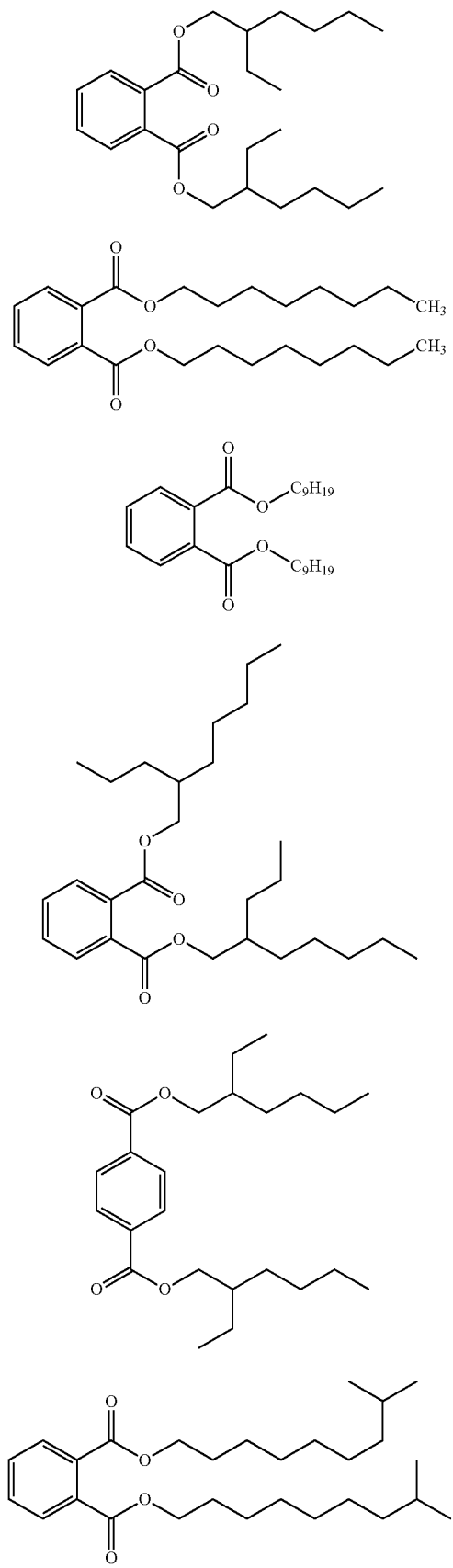

(1-1)
(1-2)
(1-3)
(1-4)
(1-5)
(1-6)

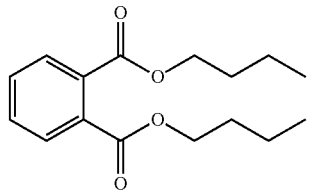

(1-7)
(1-8)
(1-9)

In accordance with some embodiments of the disclosure, a package includes a die, through insulating vias (TIV), an encapsulant, and a redistribution structure. The die includes a sensing component. The TIVs surround the die. The encapsulant laterally encapsulates the die and the TIVs. The redistribution structure is over the die, the TIVs, and the encapsulant. The redistribution structure has an opening exposing the sensing component of the die. A top surface of the redistribution structure is slanted.

In accordance with some embodiments of the disclosure, a manufacturing method of a package includes at least the following steps. Dies are formed. Each die has a sacrificial film, and the sacrificial film includes a plasticizer compound. The dies are placed on a carrier substrate. Through insulating vias (TIV) are formed to surround the dies. The dies and the TIVs are encapsulated by an encapsulant. The sacrificial film of each die is removed to form hollow portion in the encapsulant. A redistribution structure is formed over the encapsulant, the TIVs, and the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package, comprising:
    a die;
    an encapsulant laterally encapsulating the die; and
    a redistribution structure over the die and the encapsulant, wherein the redistribution structure partially exposes the die, and a top surface of the redistribution structure is slanted downward continuously from an edge of the package toward an interior of the package.

2. The package of claim 1, wherein a thickness of the die is smaller than a thickness of the encapsulant.

3. The package of claim 1, wherein the redistribution structure comprises:
a first dielectric layer covering a top surface and a portion of a sidewall of the encapsulant;
a second dielectric layer disposed over the first dielectric layer; and
conductive patterns sandwiched between the first dielectric layer and the second dielectric layer.

4. The package of claim 3, wherein an interface between the first dielectric layer and the portion of the sidewall of the encapsulant is curved.

5. The package of claim 3, wherein the first dielectric layer has a first portion on the encapsulant and a second portion on the die, and a maximum thickness of the first portion is smaller than a maximum thickness of the second portion.

6. The package of claim 3, wherein the die comprises a sensing component, the first dielectric layer comprises a first aperture exposing the sensing component, and the second dielectric layer comprises a second aperture exposing the first aperture and the sensing component.

7. The package of claim 1, further comprising:
through insulating vias (TIV) adjacent to the die; and
conductive terminals over the encapsulant opposite to the redistribution structure, wherein the conductive terminals are electrically connected to the TIVs.

8. A package, comprising:
a die comprising a sensing component;
an encapsulant laterally encapsulating the die, wherein the encapsulant has outer sidewalls and inner sidewalls opposite to the outer sidewalls, and the inner sidewalls are in physical contact with the die; and
a redistribution structure over the die and the encapsulant, wherein the redistribution structure has an opening exposing the die, and the redistribution structure comprises a first dielectric layer covering a top surface and a portion of each inner sidewall of the encapsulant.

9. The package of claim 8, wherein the portion of each inner sidewall of the encapsulant curves away from the outer sidewalls of the encapsulant.

10. The package of claim 8, wherein a thickness of the die is smaller than a thickness of the encapsulant.

11. The package of claim 8, wherein the redistribution structure further comprises:
a second dielectric layer disposed over the first dielectric layer; and
conductive patterns sandwiched between the first dielectric layer and the second dielectric layer.

12. The package of claim 11, wherein the first dielectric layer comprises a first aperture exposing the sensing component, and the second dielectric layer comprises a second aperture exposing the first aperture and the sensing component.

13. The package of claim 8, wherein a portion of the encapsulant is vertically overlapped with the die.

14. The package of claim 8, wherein the first dielectric layer has a first portion on the encapsulant and a second portion on the die, and a maximum thickness of the first portion is smaller than a maximum thickness of the second portion.

15. The package of claim 8, further comprising:
through insulating vias (TIV) adjacent to the die; and
conductive terminals over the encapsulant opposite to the redistribution structure, wherein the conductive terminals are electrically connected to the TIVs.

16. A manufacturing method of a package, comprising:
forming dies, wherein each die has a sensing component and a sacrificial film covering the sensing component, and the sacrificial film comprises a plasticizer compound;
laterally encapsulating the dies by an encapsulant;
removing the sacrificial film of each die to form hollow portions in the encapsulant; and
forming a redistribution structure over the encapsulant and the die, wherein the redistribution structure has an opening exposing the sensing component of the die, and a top surface of the redistribution structure is slanted downward continuously from an edge of the package toward an interior of the package.

17. The method of claim 16, wherein forming the dies comprises:
providing a semiconductor wafer having conductive pads and the sensing components formed thereon;
forming a sacrificial material layer over the semiconductor wafer to cover the conductive pads and the sensing components;
removing a portion of the sacrificial material layer to form the sacrificial film, wherein sidewalls of the sacrificial film are curved;
forming grooves in the semiconductor wafer; and
singulating the semiconductor wafer along the grooves.

18. The method of claim 16, wherein forming the redistribution structure over the encapsulant and the die comprises:
depositing a first dielectric layer over the encapsulant and in the hollow portions;
removing a portion of the first dielectric layer to form first apertures exposing the sensing components of the dies;
forming conductive patterns on the first dielectric layer, wherein the conductive patterns are electrically connected to the dies; and
forming a second dielectric layer over the first dielectric layer and the conductive patterns, wherein the second dielectric layer comprises second apertures exposing the first apertures and the sensing components.

19. The method of claim 18, wherein a size of each second aperture is larger than a size of each first aperture.

20. The method of claim 16, wherein the sacrificial film is removed through a wet process.

* * * * *